United States Patent [19]

Havemann

[11] Patent Number: 5,124,271
[45] Date of Patent: Jun. 23, 1992

[54] PROCESS FOR FABRICATING A BICMOS INTEGRATED CIRCUIT

[75] Inventor: Robert H. Havemann, Garland, Tex.

[73] Assignee: Texas Instruments Incorporated, Dallas, Tex.

[21] Appl. No.: 642,611

[22] Filed: Jan. 17, 1991

Related U.S. Application Data

[63] Continuation of Ser. No. 541,427, Jun. 20, 1990, Pat. No. 5,013,671.

[51] Int. Cl.$^5$ .................................. H01L 21/265
[52] U.S. Cl. .................................. 437/31; 437/28; 437/56; 437/59; 148/DIG. 9
[58] Field of Search ............ 437/31, 28, 56, 57, 437/59; 148/DIG. 9

[56] References Cited

U.S. PATENT DOCUMENTS

| | | | |
|---|---|---|---|
| 4,403,395 | 9/1983 | Curran | 437/59 |
| 4,486,942 | 12/1984 | Hirao | 437/59 |
| 4,637,125 | 1/1987 | Iwasaki et al. | 437/59 |
| 4,745,080 | 5/1988 | Scovell et al. | 437/31 |
| 4,908,326 | 3/1990 | Ma et al. | 437/59 |
| 4,981,810 | 1/1991 | Fazan et al. | 437/28 |
| 5,006,476 | 4/1991 | De Jong et al. | 148/DIG. 9 |
| 5,059,549 | 10/1991 | Furuhata | 437/59 |

Primary Examiner—Brian E. Hearn
Assistant Examiner—Tuan Nguyen
Attorney, Agent, or Firm—B. Peter Barndt; Richard Donaldson; William E. Hiller

[57] ABSTRACT

A process and structure for resolving the divergent etching requirements of a relatively thick base oxide (62) and a relatively thin gate oxide (64) in a BiCMOS integrated circuit. The necessity of etching base oxide (62) is eliminated by extending nitride mask (58) over the extrinsic base region (86) so that the relatively thick base oxide (62) only covers intrinsic base region (60) and tab region (61). Base oxide (62) at tab region (61) is partially etched in the course of forming sidewall oxide filaments (78), resulting in the residual tab oxide (62'). An extrinsic base implant is performed in extrinsic base region (86) and tab region (61), with the presence of residual tab oxide (62') affecting the profile of the implant so that it is stepped. The resulting structure, after an anneal, is extrinsic base (87'), an intrinsic base (63) (formed prior to the extrinsic base implant), and an overlap region (88') common to both. Extrinsic base (87') has a relatively greater dopant concentration compared to intrinsic base region (63). The dopant concentration in overlap region (88') is substantially that of extrinsic base (87'). The overlap region (88') insures adequate conductivity link-up between the extrinsic base (87') and the intrinsic base (63). Since no thick base oxide (62) is ever formed in extrinsic base region (86), no undesirable heavy etch is required in extrinsic base region (86), such a heavy etch being undesirable because of the necessity of an extra processing step for masking areas containing the relatively thinner oxide (64). Thus, a processing step is eliminated and yet adequate conductivity link-up between extrinsic base (87') and intrinsic base (63) is achieved via overlap region (88').

4 Claims, 7 Drawing Sheets

PROCESS FOR FABRICATING A BICMOS INTEGRATED CIRCUIT

This is a continuation of application Ser. No. 07/541,427, filed Jun. 20, 1990, now U.S. Pat. No. 5,013,671.

This invention is in the field of integrated circuits, and is specifically directed to methods of fabricating bipolar and CMOS transistors in the same integrated circuit.

BACKGROUND OF THE INVENTION

As is well known in the art, digital and linear functions are often performed by integrated circuits using either bipolar or metal-oxide-semiconductor (MOS) technology. Bipolar integrated circuits, of course, provide higher speed operation and greater drive currents than the MOS circuits, at the cost of higher power dissipation, especially when compared against complementary MOS (CMOS) circuits. Recent advances in manufacturing technology have allowed the use of both bipolar and CMOS transistors in the same integrated circuit (commonly referred to as BiCMOS devices). An example of a BiCMOS structure is described in copending application Ser. No. 481,804 filed Feb. 20, 1990 (filed as a continuation of Ser. No. 008,910, filed Jan. 30, 1987) and assigned to Texas Instruments Incorporated.

The formation of BiCMOS devices may of course be accomplished by forming the bipolar transistors according to known techniques in selected areas of the device, by additionally forming the MOS transistors according to known techniques in selected areas of the device, and interconnecting the two types of transistors. However, certain features of each type of transistor tend to be incompatible, from a process standpoint, with the other type, requiring a large number of process steps to form each. It is therefore preferable in the manufacture of such BiCMOS circuits to utilize structures which are useful in both types of transistors, in order to minimize the process complexity and cost. Such dual utilization of structural components and process steps, however, generally results in a process which is less than optimal for either the bipolar or the MOS transistors, or both.

Prior methods for forming the bipolar transistors in such structures have incorporated thin oxide layers between the diffused base region and the overlying emitter electrode (generally formed of polysilicon). The thin oxide over the base is generally formed in the same step as the gate oxide for the MOS transistors, and therefore is generally of a thickness on the order of 20 nm.

Such thin oxides separating the base region from the emitter electrode cause certain problems, however. First, performance of the bipolar transistors degrades as the emitter-to-base capacitance increases. Of course, such capacitance increases as the dielectric thickness therebetween decreases, making it preferable to have a thicker dielectric between the emitter and the base region. Second, a thin dielectric between the emitter electrode and the base region is inherently more susceptible to stress from subsequent processing steps such as contact etch, silicidation, and metal deposition and sinter. Third, a thin dielectric also increases the risk that a contact via formed over the oxide for connecting an overlying metallization layer to the emitter electrode will leak to the base region. This can occur in the event that the contact via is overetched through the emitter electrode, in which case the dielectric under the emitter electrode will be further thinned, in turn further increasing the emitter-to-base capacitance. In extreme cases, the dielectric may be etched completely through, shorting the overlying metal and the emitter electrode to the base region.

The method described in the above-referenced application, Ser. No. 008,910, using the thin MOS gate oxide and thin dielectric over the base region, avoids the stress and overetch problems by making contact to the polysilicon emitter electrode at a location away from the contact to the base region. Such a configuration does not, however, address the emitter-to-base capacitance problem, and adds the disadvantage of increasing the emitter resistance.

But, the use of a relatively thick base oxide creates its own problems. For example, the thinner gate oxide areas provide a constraint on the extent to which the base oxide may be etched. Thus in copending application Ser. No. 07/366,244 filed Jun. 12, 1989 (as a continuation of Ser. No. 07/129,271 filed Dec. 7, 1987), a gate oxide is removed from source and drain regions prior to the reach-through implant. Removal of the extrinsic region of the thicker oxide requires either masking of source/drain regions or deleterious overetching thereof. Thus an extra processing step is required because of the thickness of the base oxide.

It will also be appreciated that the sidewall filament in the vicinity of base oxide will likewise be adversely affected by the degree of overetching required to remove the extrinsic portion of the base oxide.

It is therefore an object of this invention to provide a process for forming a BiCMOS structure which incorporates a substantially thicker dielectric layer between the base and emitter of the bipolar transistors.

Another object of this invention is, specifically, to provide such a process having such a thicker dielectric in a manner compatible with the formation of the MOS transistors in the same structure, and without requiring an additional masking step at the source/drain regions of the MOS transistors to etch the base oxide.

It is yet another object of this invention to provide such a process which provides a relatively thick base oxide without requiring either deleterious over-etching of the source/drain regions or the sidewall oxides.

Other objects and advantages of the invention will be apparent to those of ordinary skill in the art having reference to the following specification in conjunction with the drawings.

SUMMARY OF THE INVENTION

The invention may be incorporated into a method for fabricating a semiconductor device, by defining a bipolar base region of a bipolar transistor with a masking layer. The masking layer covers the portions of the upper surface other than the intrinsic portion of the bipolar base region, except that a small tab region adjacent the intrinsic region is also not masked. The tab region, in accordance with the invention, insures adequate conductivity link-up (i.e. overlap of doped areas) between the intrinsic base region and the extrinsic base region, without requiring a step specifically to remove oxide from the extrinsic base region later in the process. Since such a step is avoided, no concomitant masking of relatively thinner gate oxides is required either.

The masking layer generally contains silicon nitride, for prevention of oxidation. A relatively thick base oxide layer can then be grown over the intended intrinsic base region and the tab region, and the base dopant is implanted through the base oxide in a relatively light concentration; the masking layer should also be sufficiently thick to block the base implant so that only the intrinsic base region and the tab region receive the implant. After implant of the intrinsic base region and the tab region, the masking layer may be removed.

The semiconductor device or structure also typically contains MOS transistors laterally spaced from the bipolar transistor. At some point in the process a "pregate" oxide is layered at future source/drain regions. When the pregate oxide (which is relatively thinner than the base oxide) is removed, the base oxide thickness is decreased.

An emitter region may be formed by way of polysilicon autodoping, or by another implant. A sidewall oxide filament is then formed on the polysilicon emitter by deposition and etching.

The base oxide is effectively masked from such etching by the sidewall oxide filament and polysilicon emitter except for the base oxide at the tab region. Thus the base oxide at the tab region obtains a decreased or eroded thickness with respect to the base oxide in the intrinsic region, in accordance with the present invention.

A second dopant implant, in a relatively high concentration, is then performed in the extrinsic base region. The intrinsic base region is masked from this implant but the base oxide located at the tab region, because of the erosion thereat, in accordance with the present invention does not act as a mask. The second implant penetrates into the tab region but not to as great a depth as in the extrinsic base region. Thus, the higher dopant concentration profile is stepped between the tab region and the extrinsic base region. As mentioned above, the penetration of dopant in the second implant into the tab region insures adequate conductivity link-up between the two regions of relatively higher and lower dopant concentrations without relying on lateral diffusion during annealing. In this fashion, an additional step of masking source/drain regions at the MOS transistors is eliminated while adequate conductivity link-up between the intrinsic and extrinsic regions of the base is achieved.

Likewise, additional masking of other portions of the structure, such as a sidewall filament, is eliminated. It will also be appreciated that deleterious over-etching of the source/drain or sidewall oxide regions is avoided since, as mentioned above, no step specifically to remove base oxide from the extrinsic base region is required because no base oxide is grown on the extrinsic base region.

Subsequently, formation of silicide in the tab area will likely be inhibited, but this is viewed as an acceptable trade-off for the enhanced manufacturability with the aforesaid elimination of a masking step.

The overlap region insures adequate conductivity link-up between the extrinsic base and the intrinsic base. Since no thick base oxide is ever formed in the extrinsic base region, no undesirable heavy etch is required in the extrinsic base region, such a heavy etch being undesirable because of the necessity of an extra processing step for masking areas containing the relatively thinner gate oxide. Thus, a processing step is eliminated and yet adequate conductivity link-up between the extrinsic base and the intrinsic base is achieved via the overlap region.

DESCRIPTION OF THE PREFERRED EMBODIMENTS

Figure 1:
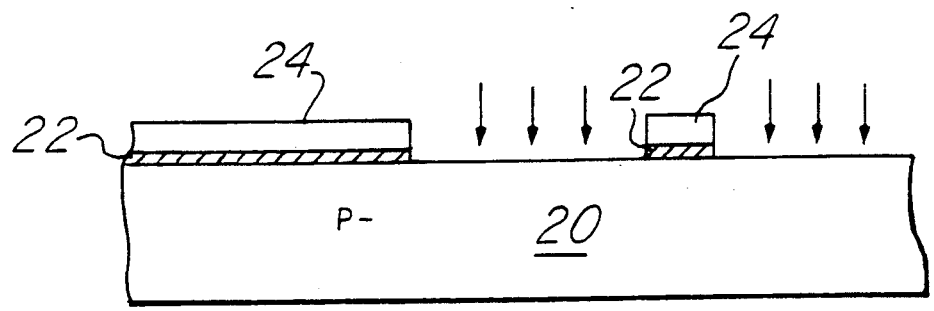
FIGS. 1 through 15, are cross-sectional views of a BiCMOS semiconductor structure in various states of fabrication, according to the process of the invention.

FIG. 1 is a cross-sectional view of a lightly doped p type single crystal silicon substrate or semiconductor body 20 in wafer form, shown prior to the formation of a buried n type layer. A masking layer consisting of silicon oxide layer 22 covered by silicon nitride layer 24 is formed according to any one of a number of well-known techniques; for example, silicon oxide layer 22 may be a grown oxide having a nominal thickness of 50 nm, and nitride layer may be deposited by low pressure chemical vapor deposition (LPCVD) to nominally 100 nm thick. Layers 22 and 24 are patterned as shown in FIG. 1, and serve as a mask for the implant of the buried n+ region, such an implant indicated by the arrows of FIG. 1. The photoresist (not shown) used for the patterning of masking layers 22 and 24 is preferably removed prior to the heavy-dose buried n+ ion implantation. An example of an implant for forming the buried n+ region in this embodiment is an antimony implant at an energy on the order of 40 keV with a dose on the order of 5E15 ions/cm$^2$.

After the implant step, the diffusion of the antimony to form buried n+ regions occurs during a high temperature anneal, such as at 1250 degrees Celsius for 30 minutes, as is typically required for antimony diffusion. The resultant depth of buried n+ regions 26 is in the range of 2 to 3 microns. Of course other dopants such as arsenic may be used to form buried n+ regions 26, which may be driven with a lower temperature anneal (e.g. 1000 degrees Celsius for arsenic). Thick oxide regions 28 are also formed during this step in the locations not covered by nitride layer 24, to a thickness of between 250 and 300 nm. The masking nitride layer 24 is then stripped after the anneal.

Figure 2:
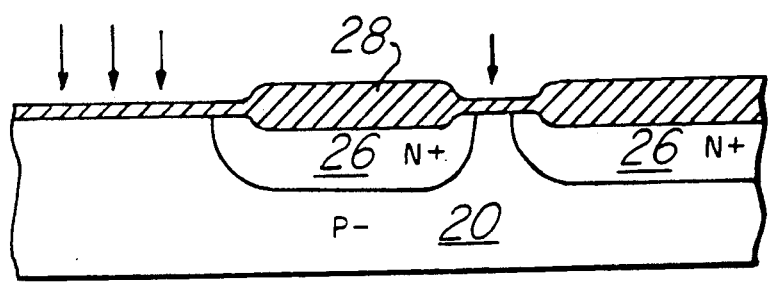

Thick oxide regions 28 of FIG. 2 serve as a mask to the ion implant for forming buried p type regions. Accordingly, a boron implant (indicated in FIG. 2 by the arrows) is performed, for example at an energy in the range of 40 to 70 keV with a dose in the range of 5E12 to 2E13 ions/cm$^2$. An anneal step is then performed to drive the implanted boron, such an anneal being done at a temperature of 900 to 950 degrees Celsius for a period of from 30 to 60 minutes, depending upon the depth desired; in this embodiment, the depth of buried p region 30 is approximately 1 micron. It should be noted that the provision of buried p regions by this implant is not essential in fabricating an operable device, as a p type substrate 20 of sufficient doping concentration to prevent punch-through between adjacent buried n+ regions 26 could alternatively be used, without the need for a buried p type region. Omission of the buried p type regions also would allow the use of a thick oxide layer as the n+ implant mask, rather than the nitride/oxide sandwich of layers 22 and 24 described above.

In addition, it should be noted that the use of thick oxide layers 28 to mask the boron implant results in a buried p type region 30 which is adjacent to and self-aligned with buried n+ region 26, without requiring another mask and pattern step. Of course, such an additional mask and pattern step prior to the boron implant may alternatively be used if a space between the eventual p type buried region and buried n+ region 26 is desired.

Figure 3:
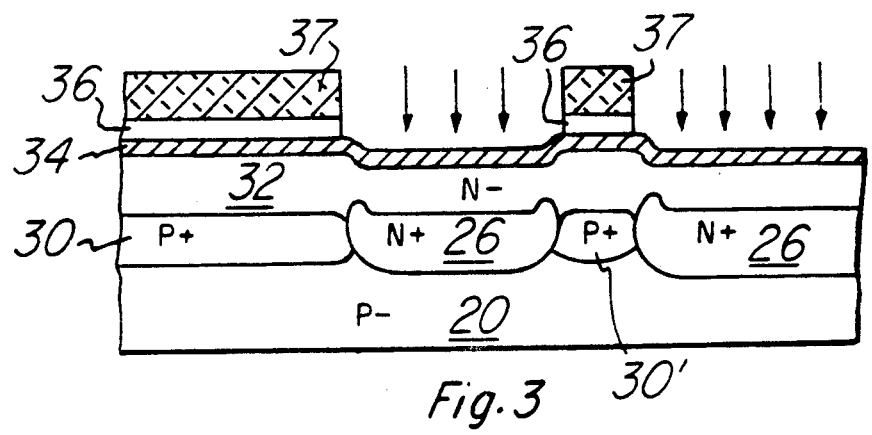

FIG. 3 illustrates buried p type region 30 formed adjacent to buried n+ region 26; p type region 30' lying in a narrow space between adjacent buried n+ regions 26 is not of sufficient size to eventually include an NMOS transistor in a p well, but will serve instead as an isolation region between the adjacent buried n+ regions 26. Subsequent to the boron implant described above, thick oxide layer 28 (as well as oxide 22) is stripped, and epitaxial layer 32 is grown according to well known techniques. Epitaxial layer 32 in this embodiment of the invention is very lightly doped n type material (i.e., greater than 10 ohm-cm resistivity), so as to be substantially intrinsic silicon. As will be described below, epitaxial layer 32 will be selectively implanted to form p type and n type wells into which both the MOS and bipolar transistors will be formed. For the benefit of the bipolar transistors, epitaxial layer 32 is kept relatively thin (for example, on the order of 0.75 to 1.50 microns), so that the length of the portion of the collector which is in the n well (between a diffused base region and buried n+ region 26) is minimized, reducing the collector resistance.

A thin layer (e.g., 35 nm) of oxide 34 is grown on the surface of epitaxial layer 32, followed by deposition of LPCVD nitride layer 36 to an approximate thickness of 100 nm. Nitride layer 36 is then patterned by photoresist layer 37 as shown in FIG. 3, to serve as a mask for the n well implant (shown by the arrows of FIG. 3), in a manner similar to nitride layer 24 described above. Oxide 34 may remain as a passivation layer over the regions into which the implant will occur, since the energy of the n well implant is high enough to place the dopant into epitaxial layer 32 through oxide 34.

Figure 4:
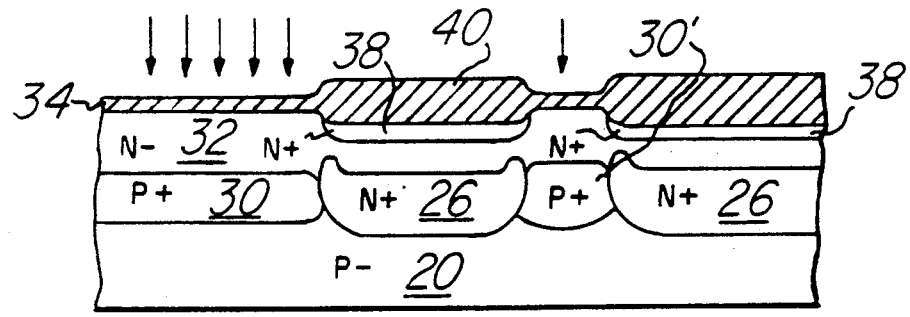

The ion implantation for forming the n wells in epitaxial layer 32 may be done by a single ion implant operation, or by multiple implants, depending upon the dopant profile desired in the n well. In this embodiment of the invention, a dual n well implant is then performed using a low-energy phosphorous implant followed by a high-energy phosphorous implant. For example, the first implant may be a dose of 1E12 ions/cm$^2$ at 70 keV, and the second implant may be done at 350 keV with a dose on the order of 1.2E12 ions/cm$^2$, resulting in the n well regions 38 as shown. The n well implant or implants may be significantly altered from that described herein, depending upon the desired dopant profile. The dual implant is followed by an oxide growth step, performed in a steam atmosphere at 900 degrees Celsius for 30 minutes, resulting in oxide layer 40 having a thickness on the order of 350 nm, covering the regions receiving the n well implant. Nitride layer 36 is then stripped, and the p well is implanted, masked by oxide regions 40 overlying the n well regions 38. The p well implant is a boron implant, for example having a dose of 1E12 ions/cm$^2$ at 50 keV, and is indicated by the arrows in FIG. 4.

Figure 5:
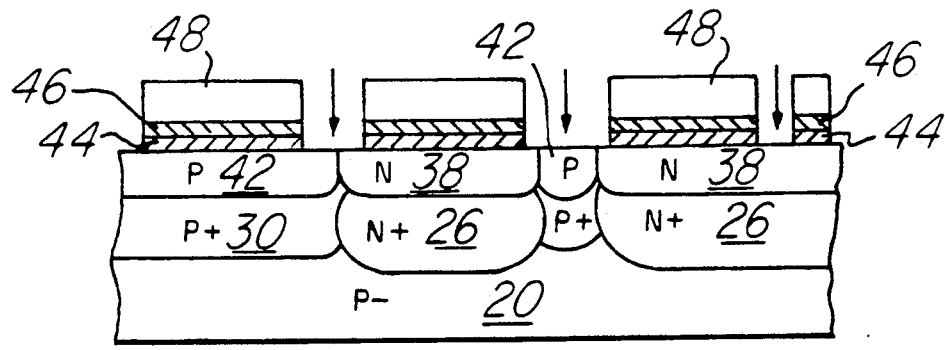

Following the p well implant, both the n well and p well implants are driven to the desired depth. Oxide region 40 and such oxide as is formed in the drive step are then stripped, leaving the n well regions 38 and p well region 42 as shown in FIG. 5. As in the case of the formation of the buried p type regions 30, p well regions 42 are formed self-aligned with n well regions 38.

This embodiment further includes additional isolation regions between the p well regions 42 and n well regions 38. Accordingly, after the oxide regions 40 are etched, a 10 nm layer 44 of silicon dioxide is grown, upon which is deposited a buffer polysilicon layer 46, having a thickness of approximately 50 nm. LPCVD nitride layer 48 is then deposited upon polysilicon 46, and the nitride/polysilicon/oxide sandwich is then patterned to expose the isolation regions. The benefits of polysilicon layer 46 as a buffer in the formation of LOCOS isolation are described in U.S. Pat. No. 4,541,167, issued Sep. 17, 1985 and assigned to Texas Instruments Incorporated. After exposure of the isolation regions, a channel-stop is implanted to supplement the p well boron concentration in p wells 42 near the surface. This supplementation overcomes the segregation of boron from p wells 42 into the isolation oxide regions during formation (such formation described below). An example of such an implant is a boron implant of a dose in the range of 3E12 to 5E12 ions/cm$^2$, at an energy on the order of 40 keV. However, it should be noted that portions of n wells 20 also receive this implant (unless a separate masking step is performed), requiring optimization of the channel-stop implant dose to adequately compensate the boron segregation from p wells 42 (i.e., to keep the field oxide threshold voltage high in p wells 42) while avoiding overcompensating the portions of n wells 38 receiving the implant (i.e., to keep the field oxide threshold voltage high in n wells 38). A high pressure oxidation step (e.g. 52 minutes in a stream environment at 10 atmospheres pressure and 900 degrees Celsius) is then performed to form recessed isolation oxide layers 50, such oxidation masked by nitride layer 48 over the active regions of the structure. It should of course be noted that any one of a number of known techniques for forming field oxide layers may be used to form oxide layers 50 (for example, more or less recess may be desirable, the poly buffering may be omitted, or formation of the oxide may occur at a different temperature or at atmospheric pressure), the method described in U.S. Pat. No. 4,541,167 is preferable, for the reasons described therein.

Figure 6:
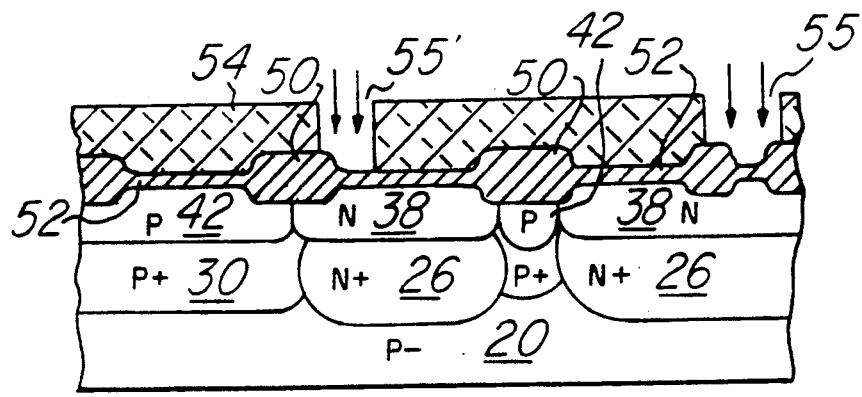

Referring now to FIG. 6, the resultant recessed isolation oxide regions 50 are illustrated. The thickness of oxide regions 50 formed by the above process is preferably at least 700 nm. Nitride layer 48, buffer polysilicon layer 46, and oxide layer 44 are etched according to conventional techniques, clearing the surface of the wafer. A thin pregate oxide, or dummy gate oxide, layer 52 is then grown to a thickness on the order of 20 nm for protection of the silicon surface during subsequent process steps leading up the the formation of the actual gate dielectric.

In operation, p wells 42 and n wells 38 will be biased so that the junctions therebetween will be reversed-biased, serving to isolate the wells from one another. Accordingly, a portion of p well 42 may be disposed between two n wells 38 for isolating the two n wells 38 from one another; an example of the need for such isolation is for isolating an n well 38 which will contain MOS transistors from an n well 38 which will contain bipolar transistors. An alternative to such junction isolation between wells is the use of trench isolation. Trench isolation is discussed in the above-referenced application Ser. No. 07/366,224.

Figure 7:
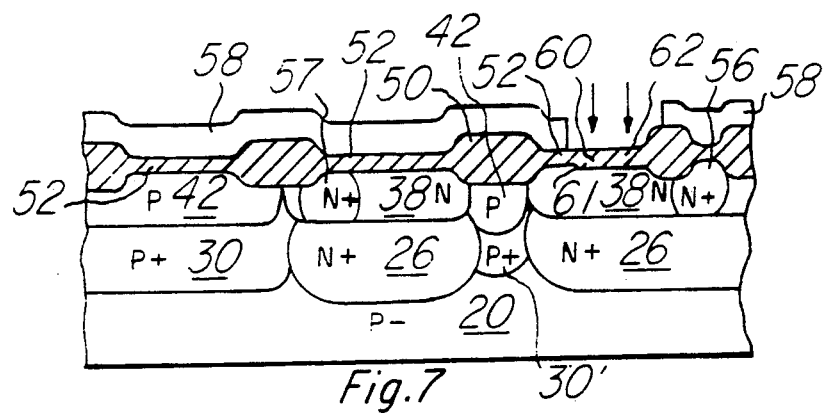

As is well known in the art, buried n+ regions 26 are especially suitable for collector electrodes of bipolar transistors. Photoresist layer 54 is shown as patterned to expose an area 55 of n well region 38 in which bipolar transistors will be formed for an n type implant (indicated by the arrows of FIG. 6) of the deep collector contact from the surface of n well region 38 to buried n+ region 26. In addition, a direct contact through n well 38 to buried n+ region 26 is preferable for n wells 38 containing MOS transistors, for purposes of reducing latch-up susceptibility; accordingly, a portion 55' of another n well 38 is exposed to receive the implant as indicated. An exemplary deep collector implant is a high energy (on the order of 150 keV) phosphorous implant, with a dose in the range of 5E15 to 2E16 ions/cm$^2$. The resultant deep collector contact 56 is illustrated in FIG. 7. Direct contact region 57 in n well 38 will also be noted.

As shown in FIG. 7 photoresist layer 54 is then stripped, prior to formation of the mask layer for definition of an intrinsic base region 60 and tab region 61 of the incipient bipolar transistor. An LPCVD polysilicon layer may be first deposited to a thickness on the order of 100 nm to minimize stress-induced defects in a similar fashion as described in the above-referenced U.S. Pat. No. 4,541,167 for poly-buffered LOCOS isolation.

Figure 17:
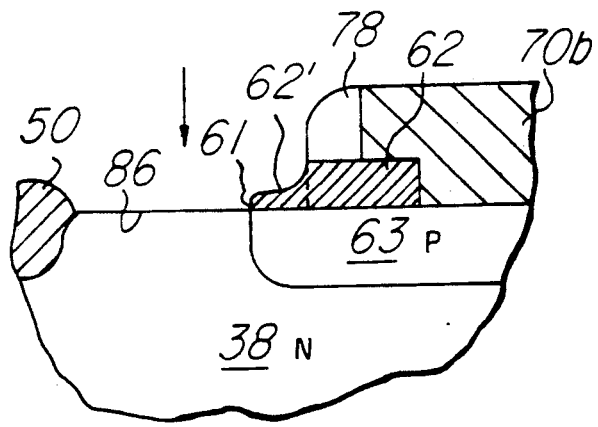
FIGS. 17 through 19 are a detailed cross-sectional view of a portion of the structure depicted in FIGS. 1 through 15.

However, in the preferred embodiment, LPCVD nitride layer 58 is directly deposited to a thickness on the order of 200-240 nm. Nitride layer 58 is then patterned and etched to define the intrinsic base region 60 plus tab region 61 as indicated in FIG. 7. Referring to FIG. 17, the intrinsic base region 60 and tab region 61 are shown in more detail after significant modification of the local area by additional processing steps.

Figure 8:
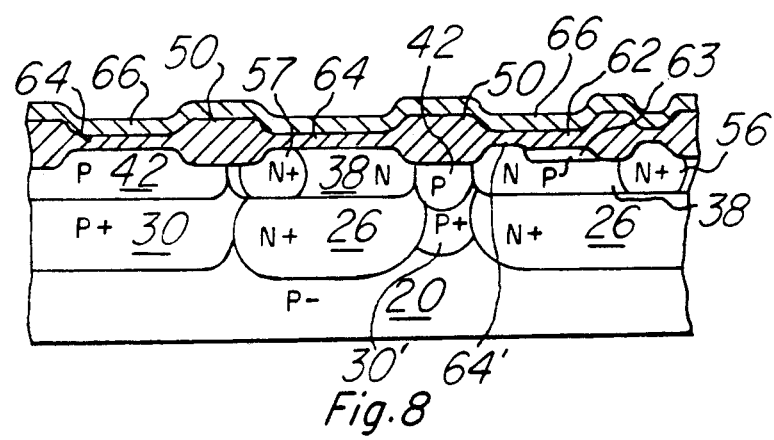

Once intrinsic base region 60 and tab region 61 are defined by the patterning and etching of layer 58 as shown in FIG. 7, a relatively thick intrinsic base oxide layer 62, for example, from 60-150 nm thick, is grown at intrinsic base region 60 and tab region 61. In the preferred method intrinsic base oxide layer is initially 140 nm for an intrinsic base implant of boron 40 keV at an energy of 40 keV. Due to the presence of nitride layer 58, no such oxide is grown other than at the exposed regions 60 and 61. The growth of oxide layer 62 is followed by the above-mentioned boron implant to form the diffused intrinsic base 63 (See FIG. 8) of the bipolar transistor, as indicated in FIG. 7 by the arrows. An exemplary base implant through the thick intrinsic base oxide 62 is a boron implant of a dose of from about 4 to about 6E13 ions/cm$^2$, at an energy of 40 keV. The thicknesses of pregate oxide 52 and nitride layer 58 are selected to block the intrinsic base implant; the above described thicknesses (e.g. 20 nm and 240 nm, respectively), are noted to be effective to block the above-described intrinsic base implant. The above implant is effective to form the intrinsic base region 63 through the intrinsic base oxide layer 62 grown to a thickness of as much as 150 nm. The advantages of the intrinsic base oxide layer 62 through which the intrinsic base implant is made will be described in further detail hereinbelow. This intrinsic base implant results in intrinsic base region 63 as shown in FIG. 8, extending to a depth approximately in the range of 300 to 400 nm from the surface. It should of course be noted that subsequent processing will reduce intrinsic base oxide layer 62 to a final thickness within a range from 80 to 120 nm, depending upon its thickness as grown.

Subsequent to the intrinsic base implant, nitride layer 58 is cleared by a wet etch and pregate ("dummy gate") oxide 52 is removed by another wet etch. As is well known in the art, a threshold voltage adjust ion implant may be done prior to pregate oxide removal to adjust the threshold voltages of the MOS transistors according to the desired circuit operation. Such an implant (not indicated in FIG. 8) is masked only by the recessed isolation oxide layer 50 and, to a lesser degree by the intrinsic base oxide 62, and is generally a p type implant of relatively low (20-35 keV) energy. In other words, the threshold adjust implant is performed after layer 58 is removed but prior to removal of pregate oxide 52 and subsequent to the addition of gate oxide 64 and polysilicon layer 66.

Referring to FIG. 8, gate oxide 64, serving as the gate dielectric for the MOS transistors, is then grown to the desired thickness, for example on the order of 20 nm. It will be noticed that a strip of extrinsic base oxide 64' is also formed to the left of intrinsic base oxide 62 as viewed in FIG. 8. A preferred method for growth of gate oxide 64 is dry/steam/dry sequence at a temperature of 850 degrees Celsius; for purposes of the instant invention, however, any well known technique may of course be used for growth of the gate oxide 64, including the use of other dielectric materials or combination of materials. Buffer polysilicon layer 66 is then deposited by way of LPCVD to a thickness on the order of 200 nm.

Figure 9:
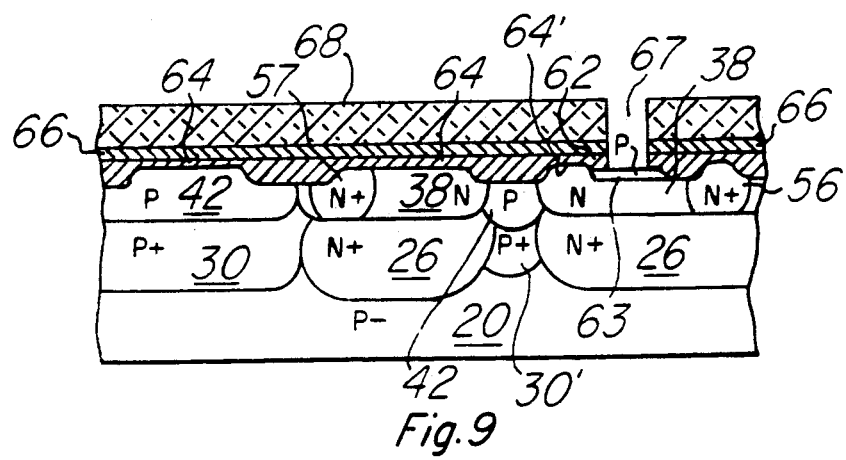
Figure 10:
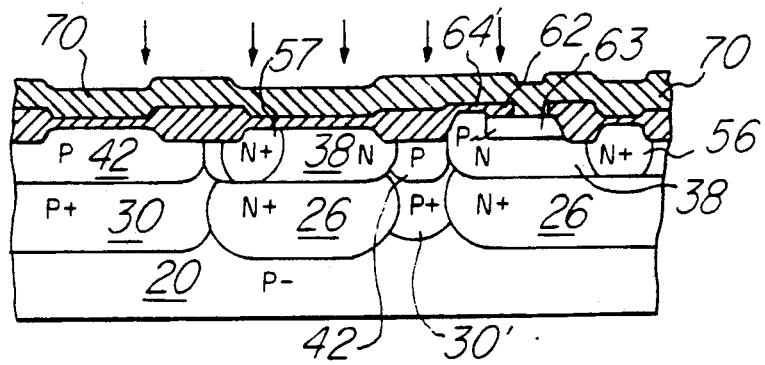

Referring now to FIG. 9, a layer of photoresist 68 is shown disposed above the surface of the wafer, patterned to define the location of the emitter for the bipolar transistor. Polysilicon layer 66 and oxide layer 62 above selected portions of intrinsic base region 60 are then etched to expose the location 67 of the incipient emitter contact in intrinsic base region 63. After exposing the incipient emitter contact, photoresist 68 is stripped, and a layer of polysilicon 70 is deposited by LPCVD over the surface of the wafer, contacting intrinsic base 63 in the incipient emitter contact area as shown in FIG. 10. Polysilicon layer 70 is deposited to a thickness of 250 nm, and will serve as the gate electrode for the MOS transistors, and as an interconnect level, if desired. Polysilicon layer 70 will also serve as the source of the dopant for diffusion into the incipient emitter region in intrinsic base 63 of the bipolar transistor, as described below. Polysilicon layer 70 is additive to polysilicon layer 66 at locations not in the incipient emitter contact, resulting in thicker polysilicon at those locations. Polysilicon layer 70 is then doped by way of an n+ implant (for example, an arsenic and phosphorus implant of a dose on the order of 1E16 ions/cm$^2$ at 50 keV [arsenic] and 2E15 ions/cm$^2$ at 80 keV [phosphorus]) as indicated by the arrows in FIG. 10.

Figure 11:
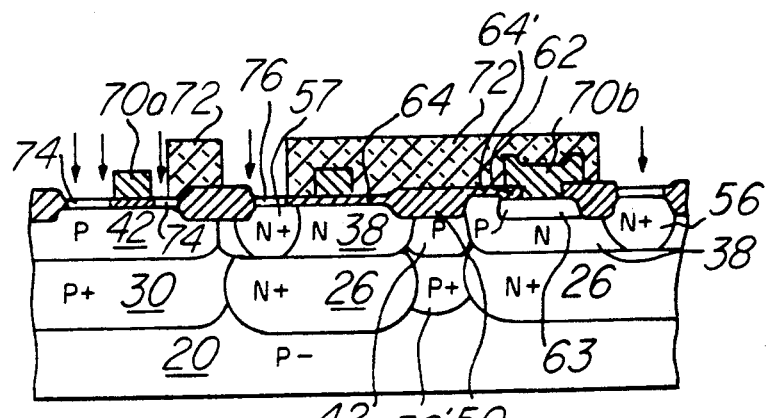

Referring to FIG. 11, polysilicon layer 70 is shown after being patterned and etched for the formation of the gate electrodes 70a for the MOS transistors and the polysilicon emitter 70b of the bipolar transistor. Subsequent to the polysilicon etch, a layer of TEOS oxide (not shown) may be deposited (e.g. on the order of 30 nm) to passivate the silicon surface and to minimize ion channeling into the source and drain regions during subsequent implant steps; this thin layer of TEOS oxide will also serve to offset the reach-through implant from the gate electrode 70a, compensating for lateral diffusion of the reach-through implant for better alignment with the edges of gate electrode 70a. Photoresist layer 72 is patterned to define the source and drain regions 74 for the n-channel MOS transistor, and for defining the n well contact 76 to be implanted by a phosphorous reach-through implant (indicated by the arrows in FIG. 11). Collector contact 56 and buried n+ region contact 57 also can receive this implant. The reach-through implant is intended to form the shallow and relatively lightly-doped n type diffusion in the formation of an n-channel MOS transistor having a "lightly-doped-drain" (or graded junction) as described in U.S. Pat. No. 4,566,175 issued Jan. 28, 1987 and assigned to Texas Instruments Incorporated. An example of such a reach-through implant is a dose on the order of 2E13 ions/cm$^2$ at an energy of 80 keV.

Figure 12:
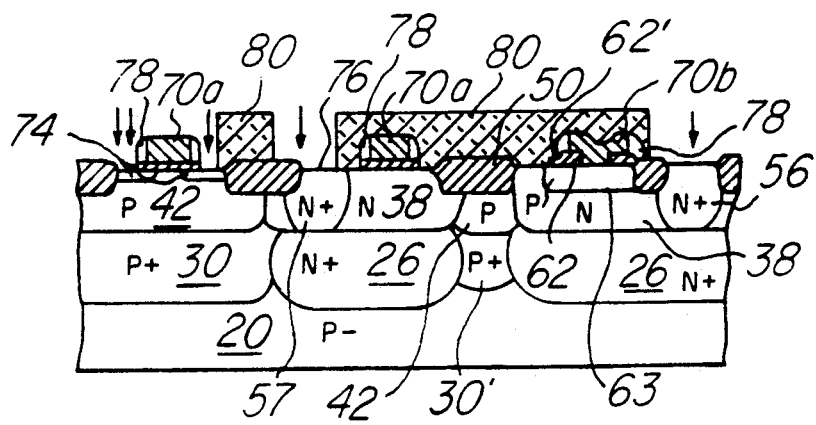

FIG. 12 illustrates the formation of sidewall oxide filaments 78 on each side of gate electrodes 70a and polysilicon emitter 70b. Such formation is accomplished by stripping photoresist 72 (compare FIGS. 11 and 12), depositing a conformal layer of TEOS oxide over the wafer (in this example, approximately 200 nm thick), and then anisotropically etching the oxide layer as described in the above-referenced U.S. Pat. No. 4,566,175, leaving the sidewall filaments 78 shown in FIG. 12. The etch, utilizing $C_2F_6$, $CHF_3$ and $He_2$ in the preferred embodiment, is performed with a 10–20% over-etch of the conformal layer of TEOS oxide. Thick oxide 62 is thus also partially etched at the locations not covered by the polysilicon emitter 70b and sidewall filaments 78.

Thus a residual tab oxide 62' in the tab region 61 is formed by this partial etch to form the structure as indicated in FIGS. 12 and 17, in accordance with the present invention. Oxide 64 is also removed by the same etch. In this manner, no masking step is required to protect source/drain regions 74, as would be necessary if the thicker intrinsic base oxide 62 extended to the left all the way to isolation oxide 50 and thus required an independent etching step. In the preferred method, however, the marginal overetch used in forming filaments 78 is sufficient to erode tab oxide 62' for purposes discussed hereinbelow.

An additional layer of TEOS oxide (not shown) may be deposited as before for passivation of the surface and for reduction of ion channeling during implant, and photoresist 80 is patterned to again expose the n-channel source and drain regions 74, n well contact 76, and collector contact 56. The source/drain implant is now performed, forming the deeper junction depth for the heavily doped source and drain of the n-channel MOS transistor; an example of such a source/drain implant (indicated by the arrows in FIG. 12) is a high energy arsenic implant (e.g. at 150 keV) having a dose of 3E15 ions/cm$^2$, followed by a lower energy phosphorous implant (e.g. at 95 keV) having a dose on the order of 4E14 ions/cm$^2$.

Figure 13:
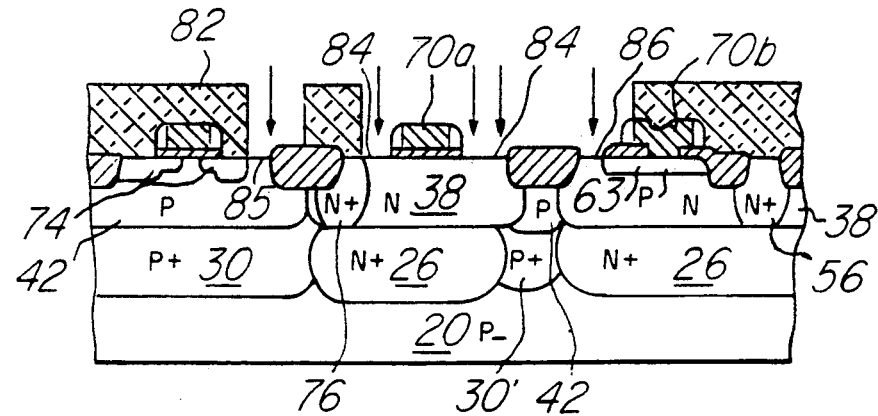

FIG. 13 illustrates the formed source and drain regions 74 of the n− channel MOS transistor in p well 42, as well as the n+ contact 76 in n well 38. Photoresist 80 is stripped, and a photoresist pattern 82 is formed to define the source/drain regions 84 for the p channel MOS transistor in n well 38, as well as p+ contact 85 in p well 42 and p+ extrinsic base region 86. The boron source/drain implant is indicated by arrows in FIG. 13, for example, having a dose of 3E15 ions/cm$^2$ at an energy of 20 keV.

FIG. 17 is a detailed view of the extrinsic base region 86 and the surrounding area. Once again, the implant indicated in FIG. 13 is depicted, however, this portion is more appropriately referred to as an extrinsic base implant. It is contemplated and within the scope of this invention that dopant may be delivered into extrinsic base region 86 and tab region 61 by alternatives other than implanting, e.g. dopant may be deposited on the upper surface of extrinsic base region 86 and tab oxide 62' and then driven downward.

Figure 18:
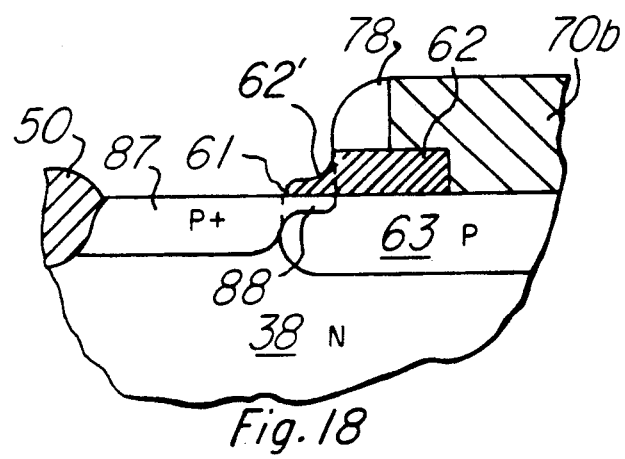

Referring to FIG. 18, the resultant structure immediately after the implant is shown. In particular, incipient extrinsic base 87 and incipient overlap region 88 are shown in detail. Overlap region 88 is a region of overlap between the extrinsic base 87 and the intrinsic base 63 where the dopant concentration is substantially that of the extrinsic base, being the higher dopant concentration region. It will be noted that due to the presence of residual tab oxide 62', the lower surface of the overlap region is closer to the upper surface of the substrate than is the lower surface of the extrinsic base. In other words, the depth of the extrinsic base implant is affected by the partial screening of the tab oxide 62' so as to form a stepped configuration.

Figure 19:
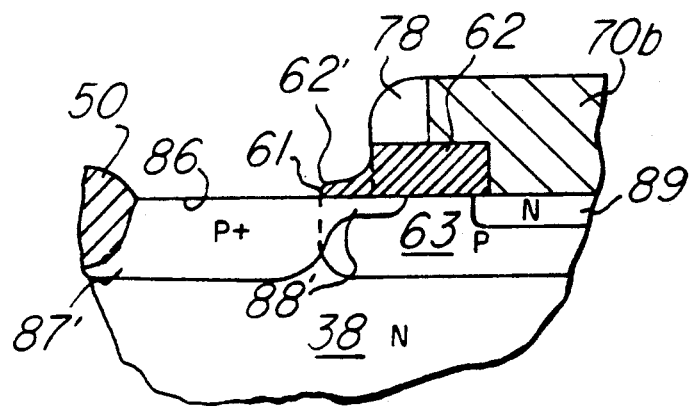

FIG. 19 shows the resulting structure after the extrinsic base implant has been driven to the desired level. The extrinsic base region 87' and the overlap region 88' still show substantially the same step, but it will be noted that the overlap region 88' is somewhat enlarged as compared to the initial overlap region 88. In this fashion, a substantial conductivity link-up between intrinsic base region 63 and extrinsic base region 87' is assured.

The concentration of dopant in extrinsic base region 87' and overlap region 88' is on the order of 1E19 ions/cm$^3$ or greater. The concentration of dopant in intrinsic base region 63 is on the order of 1E17 to 1E18 ions/cm$^3$. According to the invention, the partial penetration of extrinsic base implant through residual tab oxide 62' allows initial overlap before driving of the dopant. Thus, overlap is insured without relying on lateral diffusion during the drive which could be potentially inadequate to insure proper functioning of the bipolar transistor. Thus, according to the invention, adequate electrical conductivity link-up between the extrinsic and intrinsic base regions is achieved without the undesirable lateral extension of the thick base oxide into the extrinsic region.

Figure 14:
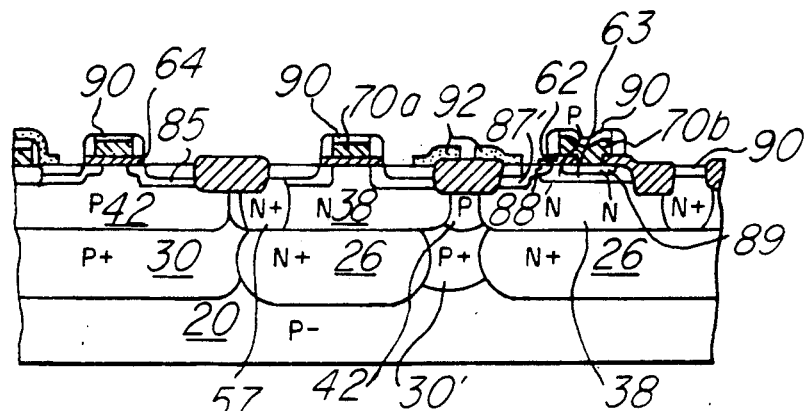

Referring now to FIG. 14, after the completion of both the source/drain implants and extrinsic base implant shown in FIG. 13, the implanted dopants (as discussed above) are driven by a high temperature anneal in an inert atmosphere, such as a 30 minute anneal at 900 degrees Celsius in an argon atmosphere. This anneal not only drives the implants, but also causes the dopant in polysilicon emitter 70b to diffuse into intrinsic base 63, forming emitter 89 therein, as described in U.S. Pat. No. 4,799,099, issued Jan. 17, 1989 and assigned to Texas Instruments Incorporated. The emitter junction depth from such a process is in the range of 100 to 150 nm; the anneal also pushes the depth of intrinsic base 63 to a certain extent under the emitter 89 (i.e., "emitter push").

Optionally, after this source/drain and emitter anneal, any remaining oxide (other than field oxide), such as tab oxide 62', may be substantially cleaned from the source, drain and contact regions into which the source/drain implants were made, as well as polysilicon 70. The selected areas may then be silicide-clad if desired, by deposition of a metal such as titanium for a direct reaction with the exposed silicon, followed by an oxide cap, as described in U.S. Pat. No. 4,690,730 issued Sep. 1, 1987, assigned to Texas Instruments Incorporated. Note that silicide formation may be inhibited at tab area 61 by vestigial amounts of oxide at the former location of tab oxide 62'. The thickness of tab oxide 62' at this point will typically range between 0 and 60 nm. The result is the formation of titanium silicide layers 90 shown in FIG. 14. As described in U.S. Pat. No. 4,675,730, issued Jun. 23, 1987 and assigned to Texas Instruments Incorporated, local interconnections 92 may subsequently be made by patterning and etching the unreacted titanium on the silicide and oxide layers and by exposing the patterned titanium film to a nitrogen atmosphere.

Figure 15:
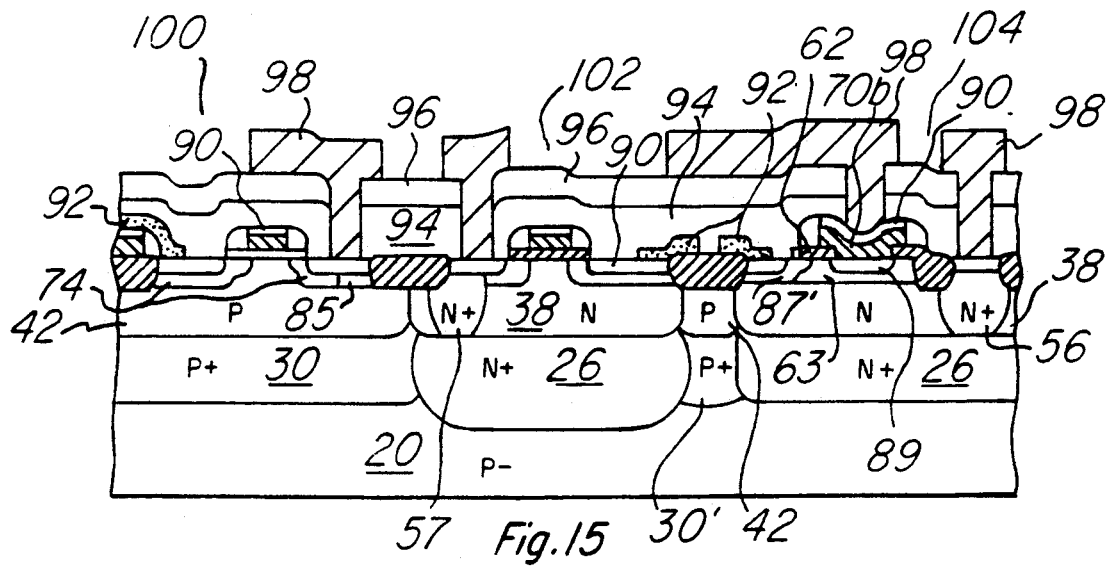

Referring now to FIG. 15, the first level of metal interconnect is illustrated as connected to the various locations within the fabricated structure. A multilevel dielectric is formed of a relatively thick (on the order of 1 micron) first layer 94 of LPCVD TEOS oxide. Layer 94 is then planarized and etched back as described in U.S. Pat. No. 4,795,722, issued Jan. 3, 1989 and assigned to Texas Instruments Incorporated. The planarized TEOS oxide 94 may then be coated with a second TEOS oxide layer (e.g. approximately 100 nm thick). This is followed by a layer of phosphorous doped oxide 96, having a thickness on the order of 300 nm and a phosphorous concentration of 5% by weight. Phosphorus-doped oxide 96 is activated and densified by a high temperature anneal, for example 60 minutes at 700 degrees Celsius, and then contact vias are patterned and etched. A first level metallization 98 may then be deposited to make contact to the various locations in the structure, and may consist of a standard aluminum, or doped aluminum metallization, or of a first layer of titanium tungsten alloy followed by a layer of CVD tungsten. The TiW system is especially useful in multilevel metal systems; an additional level of metal interconnect may of course be added to the structure of FIG. 15, making contacts to first metallization 98 through vias formed according to known techniques.

It should be noted that the intrinsic base oxide layer 62 underlying the portion of polysilicon 70 which forms the polysilicon electrode for the bipolar transistor achieves certain benefits. First, the polysilicon emitter electrode 70 is separated from intrinsic base 63 by a greater distance due to the thicker intrinsic base oxide layer 62, reducing the capacitance between the emitter electrode 70 and intrinsic base 63, thereby improving the switching speed of the bipolar transistor. In addition, it can be seen that the first metal contact to the emitter electrode 70 is made directly over emitter 89, saving the surface area required for the formation of the bipolar transistors, as well as reducing the emitter resistance by reducing the length of the current path in the emitter electrode. In prior circuits such stacking of the contact resulted in reliability degradation due to leakage from emitter electrode to base caused by stressing of the thin dielectric therebetween.

After the first level metallization illustrated in FIG. 15, the presence of the two channel-conductivity MOS transistors, well connections, and a bipolar transistor can be easily seen as fabricated into the single substrate 20. N-channel transistor 100 is shown as fabricated into p well 42 at the left side of FIG. 15, having its source region and well contact connected to ground through first level metal 98, and having its drain region contacted by local interconnection layer 92. The p-channel transistor 102 is similarly biased, with its source and well contact connected to the $V_{dd}$ power supply, and its drain region contacted by patterned local interconnect 92. Bipolar transistor 104 formed into the n well 38 at the right side of FIG. 15 has a subcollector in buried n+ region 26, contacted by first level metal 98 through deep collector contact 56. The emitter 89 is also contacted by patterned first level metal 98 via polysilicon emitter 70b and silicide layer 90, while intrinsic base 63 is contacted by patterned local interconnect layer 92 via extrinsic base region 87'.

Figure 16:
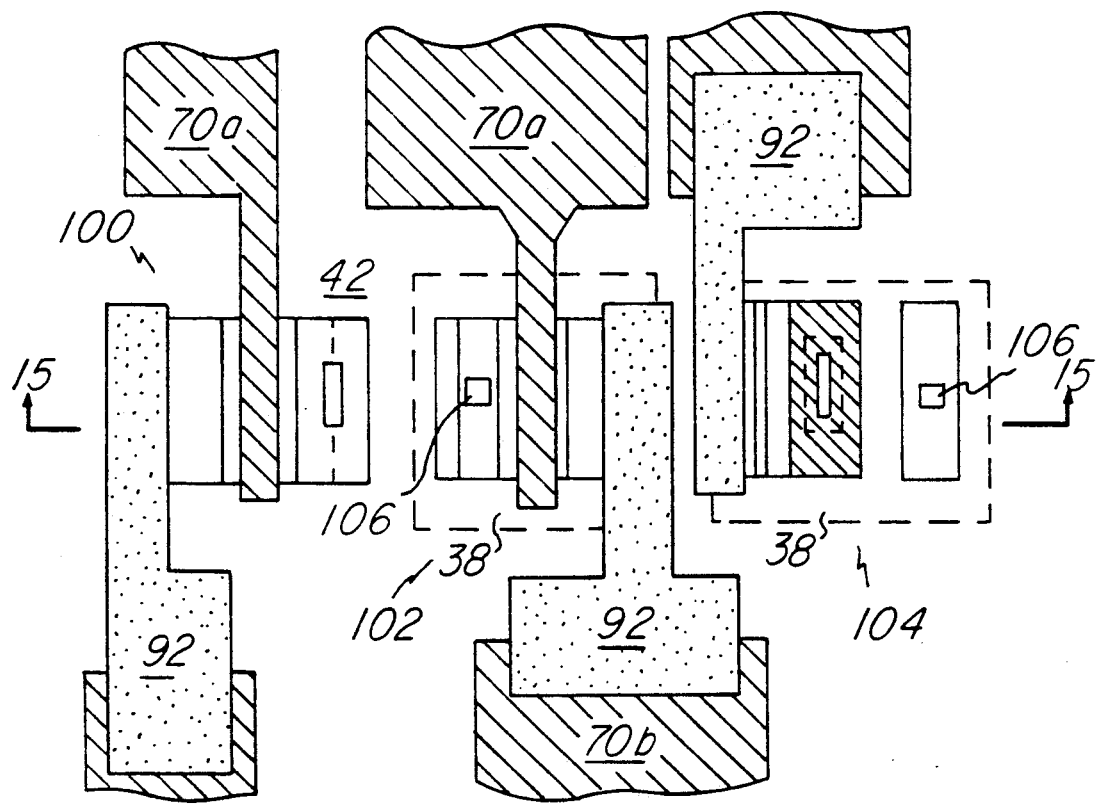
FIG. 16 is a plan view of the structure of FIG. 15.

Referring now to FIG. 16, a plan view is shown of the structure of FIG. 15 with metal layer 98 omitted for purposes of clarity. Contact vias 106 are also shown, indicating the etched locations of layers 94 and 96 for metal-to-silicon contacts. In this embodiment, n wells 38 appear as islands in a single p well 42. Local interconnects 92 are shown to overlap onto polysilicon layers 70, for connection to other locations of the integrated circuit.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such changes and additional embodiments will of course include variations on the implant conditions, oxidation and diffusion cycles, and metallization systems described herein. It is contemplated that all such changes and additional embodiments are within the spirit and true scope of the invention as claimed below.

What is claimed is:

1. A method for fabricating a BiCMOS integrated circuit in a surface of a semiconductor body including base region and a gate region, the method comprising:
   (a) providing a base oxide in the base region, the base oxide presenting a thickness;
   (b) providing a gate oxide in selected portions of the surface of the semiconductor body, including the gate region, the gate oxide presenting a predetermined thickness less than the thickness of the base oxide;
   (c) etching both the base oxide and selected portions of the gate oxide not in the gate region, such that substantially the entire thickness of the selected portions of the gate oxide is removed from the semiconductor body and a partial thickness of the base oxide remains on the semiconductor body, whereby the thicker base oxide provides reduced emitter-base capacitance, while the reduced portion of the base oxide allows for adequate extrinsic-intrinsic base overlap while requiring a lesser etch for complete etch of the base oxide thickness.

2. The method of claim 1, wherein the gate oxide of step (b) is grown at two laterally spaced locations comprising a p well formed in the semiconductor body and an n well form formed in the semiconductor body.

3. The method of claim 1, wherein the base oxide of step (a) is grown to a thickness of from 60 to 150 nm.

4. The method of claim 1, wherein the gate oxide of step (b) is grown to a thickness of about 20 nm.

* * * * *